(12) United States Patent
Tahara

(10) Patent No.: US 6,171,396 B1
(45) Date of Patent: Jan. 9, 2001

(54) GROWING SYSTEM FOR UNIFORMLY GROWING THIN FILM OVER SEMICONDUCTOR WAFER THROUGH ROTATION

(75) Inventor: Keiichiro Tahara, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/280,638

(22) Filed: Mar. 29, 1999

(30) Foreign Application Priority Data

Apr. 3, 1998 (JP) .................................................. 10-108670

(51) Int. Cl.[7] .................................................. C30B 35/00
(52) U.S. Cl. ............................ 117/204; 117/200; 117/900
(58) Field of Search .................................. 117/58, 94, 98, 117/101, 106, 107, 200, 204, 900

(56) References Cited

FOREIGN PATENT DOCUMENTS

| | | |
|---|---|---|
| 2277748 | 11/1994 | (GB) . |
| 55-149951 | 4/1979 | (JP) . |
| 57-151523 | 9/1982 | (JP) . |
| 3-123025 | 5/1991 | (JP) . |
| 8-162416 | 6/1996 | (JP) . |
| 8-203835 | 8/1996 | (JP) . |

OTHER PUBLICATIONS

Abstract of Japanese Patent No. 96–347533.

*Primary Examiner*—Felisa Hiteshew
(74) *Attorney, Agent, or Firm*—Hutchins, Wheeler & Dittmar

(57) ABSTRACT

An atmospheric pressure chemical vapor deposition system includes plural meshed conveyer belts extending in parallel for transferring semiconductor wafers at intervals, a reactant gas injector located over the plural meshed conveyer belts for creating reacting zone over the conveyer belts and a driving mechanism for moving the plural conveyer belts, wherein the driving mechanism moves the conveyer belts at different speeds so as to give rise to a rotation of each semiconductor wafer in the reacting zone, thereby uniformly exposing the entire surface of the semiconductor wafer to the reactant gases, which creates the depositing conditions different in the reacting zone.

12 Claims, 3 Drawing Sheets

GROWING SYSTEM FOR UNIFORMLY GROWING THIN FILM OVER SEMICONDUCTOR WAFER THROUGH ROTATION

FIELD OF THE INVENTION

This invention relates to a semiconductor fabrication technology and, more particularly, to a growing system for growing a thin film over a semiconductor wafer and a process for fabricating a semiconductor device using the same.

DESCRIPTION OF THE RELATED ART

While a manufacturer is fabricating an integrated circuit on a semiconductor wafer, various kinds of material are sequentially grown on the semiconductor wafer, and the thin layers are patterned into inter-level insulating layers with contact holes and conductive strips for electric signals. One of the technical goals of the thin film growth is uniformity of thickness over the semiconductor wafer.

An atmospheric pressure chemical vapor deposition system is a typical example of the thin film growing apparatus. The atmospheric pressure chemical vapor deposition system has a reactor, and a reaction chamber is formed inside the reactor. A belt conveyer is provided in the reaction chamber, and semiconductor wafers are placed on the belt conveyer. A heater is provided under the belt conveyer, and heats the semiconductor wafers on the belt conveyer. While the semiconductor wafers are passing in the reaction chamber, a gas injection unit injects reactant gases to the semiconductor wafers. The reactant gases react with one another, and material is deposited on the semiconductor wafers.

FIG. 1 illustrates the prior art atmospheric pressure chemical vapor deposition system. A conveyer belt 1 is installed in a reaction chamber 2, and semiconductor wafers 3a/3b are placed on the conveyer belt 1 at intervals. A heater is provided under the conveyer belt 1, and maintains the semiconductor wafers at a predetermined temperature. Though not shown in FIG. 1, a suitable driving mechanism is connected to the conveyer belt 1, and moves the semiconductor wafers 3a/3b in a direction indicated by arrow AR1. The conveyer belt 1 is unitary, and the entire surface of the conveyer belt 1 is moved at a constant speed. For this reason, the semiconductor wafers 3a/3b are stationary on the conveyer belt 1.

A gas injection unit 4 is provided over the conveyer belt 1, and the semiconductor wafers 3a/3b passes under the gas injection unit 4. Reactant gases are injected from the gas injection unit 4 to the semiconductor wafers 3a/3b, and the reaction product is grown on the entire surfaces of the semiconductor wafers 3a/3b.

However, the manufacturer encounters a problem in that the growth rate is not constant over the upper surface of the semiconductor wafer 3a/3b. This is because of the fact that the temperature and the growing time are not strictly constant over the semiconductor wafer 3a/3b. Although the manufacturer varies the gas injection area and the gas flow rate in the lateral direction of the conveyer belt 1, the prior art atmospheric pressure chemical vapor deposition system can not achieve a uniform thin film over the semiconductor wafer 3a/3b.

Japanese Patent Publication of Unexamined Application No. 8-203835 discloses an atmospheric pressure chemical vapor deposition system. The prior art atmospheric pressure chemical vapor deposition system includes a conveyer belt straightforwardly moved along a guide and a reactant gas injecting unit provided over the conveyer belt for injecting reactant gases to semiconductor wafers conveyed by the conveyer belt. The semiconductor wafers are not directly put on the upper surface of the conveyer belt. Plural platens are placed on the conveyer belt, and each platen has turntables and motors for driving the turntables for rotation. The semiconductor wafers are respectively put on the turntables, and are also rotated on the conveyer belt. While the semiconductor wafers are passing through a growth region under the reactant gas injection unit, the motors rotate the turn tables and, accordingly, the semiconductor wafers put thereon, and thin films are grown on the surfaces of the semiconductor wafers, respectively.

The Japanese Patent Publication of Unexamined Application insists that the thin films are constant in thickness due to the rotation. However, the platen is a complicated mechanical unit including the motor and the turntable, and creates undesirable environment around the semiconductor wafers. First, the platens do not permit the heater under the conveyer belt to directly heat the semiconductor wafers. The heater heats the platens, and the platens propagate the heat to the semiconductor wafers. As a result, the temperature on the semiconductor wafers is different, and the chemical reaction is not stable over the semiconductor wafer. Moreover, the platens on the conveyer belt serve as an obstacle against the reactant gas flow. In order to make the growth rate constant, the reactant gas composition is to be stable throughout the reacting zone over the semiconductor wafer. For this reason, the conveyer belt is usually a net of suitable meshes, and the mesh conveyer belt permits the reactant gases to pass. In other words, the mesh conveyer belt makes the reactant gases fresh in the reacting zone. If the platens are placed on the conveyer belt, the reactant gases tend to stagnate in the reacting zone, and the reactant gas composition becomes unstable. Thus, the platens on the conveyer belt disturb the chemical reaction, and it is difficult to uniformly grow the thin films on the semiconductor wafers.

Moreover, the motors and the turntables are heated to a high temperature, and a heat-resistant motor and a turntable made of heat-resistant material are expensive. For this reason, the prior art atmospheric pressure chemical vapor deposition systems are not feasible.

Other related prior arts are disclosed in Japanese Utility Model Application No. 54-50227 and Japanese Patent Publication of Unexamined Application Nos. 57-151523, 3-123025 and 8-162416. Although the present inventor does not think the prior art technologies disclosed therein to be opposed against the present invention, the prior art technologies disclosed therein are described hereinbelow.

Japanese Utility Model Application No. 54-50227 discloses a conveying apparatus used for transferring semiconductor wafers to the next stage. The conveying apparatus disclosed in the Japanese Utility Model Application includes two rubber belts extending in parallel for conveying semiconductor wafers to the next treatment system, and the two rubber belts are independently driven at different speeds. As well known, a semiconductor wafer has a straight edge called as "orientation flat". A detector monitors the semiconductor wafers on the two rubber belts to see whether the straight edge is oriented to a predetermined direction or not. If the straight edge is not oriented to the predetermined direction, the two rubber belts are moved at different speeds so as to rotate the semiconductor wafer until the predetermined direction. On the other hand, when the straight edge is oriented to the predetermined direction, the two rubber belts are moved at same speed, and the prior art conveying apparatus keeps the attitude of the semiconductor wafer on the two rubber belts.

The prior art conveying apparatus independently changes the moving speeds of the rubber belts, and the rubber belts moved at different speeds give rise to a rotation of the semiconductor wafer. However, the prior art conveying apparatus is available for a transfer from an apparatus to the next apparatus, and the relative moving speed between the rubber belts is changed for the attitude control. In other words, the Japanese Utility Model Application does not teach nor suggests a continuous rotation of all the semiconductor wafer in the reacting zone.

Japanese Patent Publication of Unexamined Application No. 57-151523 discloses a conveying apparatus for disk-shaped members. The prior art conveying apparatus disclosed in the Japanese Patent Publication of Unexamined Application also aims at attitude control for a disk-shaped member. The prior art conveying apparatus includes two straight-forwarded conveyers moved at different speeds and a guide member extending along the straight-forwarded conveyers. The disk-shaped member has a protrusion radially projecting from the periphery of the disk-shaped member, and is placed on the two straight-forwarded conveyers.

The two straight-forwarded conveyers are moved at different speeds, and the relative speed gives rise to a rotation of the disk-shaped member on the two conveyers. The protrusion is brought into contact with the guide member, and the disk-shaped member stops the rotation on the conveyers. Finally, all the disk-shaped members are regulated to the same attitude on the conveyers, and reach the terminal end of the conveying apparatus.

Although the prior art conveying apparatus gives rise to the rotation of the disk-shaped members, the rotation aims at the attitude control. The Japanese Patent Publication of Unexamined Application does not teach any application to a semiconductor fabrication technology, nor suggests. This is clearly understandable, because the semiconductor wafer does not have any protrusion indispensable in the prior art attitude control.

Japanese Patent Publication of Unexamined Application No. 3-123025 discloses an atmospheric pressure chemical vapor deposition system. The prior art atmospheric pressure chemical vapor deposition system disclosed in the Japanese Patent Publication of Unexamined Application has a conveyer implemented by hot plates linked with one another for forming a loop. Semiconductor wafers are placed on the hot plates, and successively pass the reacting zone under a reactant gas injector.

When the hot plates change the moving direction along the loop, the hot plates p s turn, and the semiconductor wafers on the hot plates also turn. However, the reactant gas injector is placed over a straight portion of the loop, and neither hot plate nor semiconductor wafer turn under the reactant gas injector.

Japanese Patent Publication of Unexamined Application No. 8-162416 discloses an atmospheric pressure chemical vapor deposition system. The prior art atmospheric pressure chemical vapor deposition system also aims at constant growth through a relative motion between a reactant gas injector and semiconductor wafers on a conveyer belt.

The Japanese Patent Publication of Unexamined Application proposes two kinds of relative motion. The first relative motion is offered by a reciprocal motion of the reactant gas injector. The reactant gas injector is reciprocally moved in the direction perpendicular to the moving direction of the conveyer belt. The second relative motion is offered by rotating the semiconductor wafers on the conveyer belt. The Japanese Patent Publication of Unexamined Application merely teaches that turntables are provided in holes formed in the conveyer belt at intervals. The Japanese Patent Publication of Unexamined Application is silent to how the turntables are rotated in the holes. However, the turntables are causative of the undesirable environment for the stable chemical reaction inherent in the prior art atmospheric pressure chemical vapor deposition disclosed in Japanese Patent Publication of Unexamined Application No. 8-203835.

In this situation, it is impossible to motivate a person skilled in the art to combine the prior art technologies disclosed in Japanese Utility Model Application No. 54-50227 and Japanese Patent Publication of Unexamined Application No. 57-151523 with the atmospheric pressure chemical vapor deposition systems disclosed in Japanese Patent Publication of Unexamined Application Nos. 8-162416 and 8-203835, because the uniform orientation through the attitude control is not required for the relative motion between the reactant gas injector and the semiconductor wafers.

SUMMARY OF THE INVENTION

It is therefore an important object of the present invention to provide a growing system, which uniformly grows material on semiconductor wafers under stable environment.

It is also an important object of the present invention to provide a process used in the growing system.

To accomplish the object, the present invention proposes to rotate semiconductor wafers on conveyers moved at different speeds.

In accordance with one aspect of the present invention, there is provided a growing system comprising a growing means creating a growing zone for growing a material on wafers, a plurality of conveying members passing through the growing zone and transferring the wafers through the growing zone to a destination, and a controller connected to the plurality of moving members and regulating the plurality of conveying members to respective moving speeds different from one another so as to give rise to a rotation of each of the wafers on the plurality of conveying members during the transfer through the growing zone.

In accordance with another aspect of the present invention, there is provided a process for growing material on wafers comprising the steps of a) placing each of the wafers on a plurality of conveying members moved at different speeds, b) transferring the each of the wafers toward a destination so as to give rise to a rotation of the aforesaid each of the wafers on the plurality of conveying members, and c) growing the material on the aforesaid each of the wafers while the plurality of conveying members are rotating the aforesaid each of the wafers.

BRIEF DESCRIPTION OF THE DRAWINGS

The features and advantages of the growing system and the process will be more clearly understood from the following description taken in conjunction with the accompanying drawings in which.

DESCRIPTION OF THE PREFERRED EMBODIMENT

Figure 1:
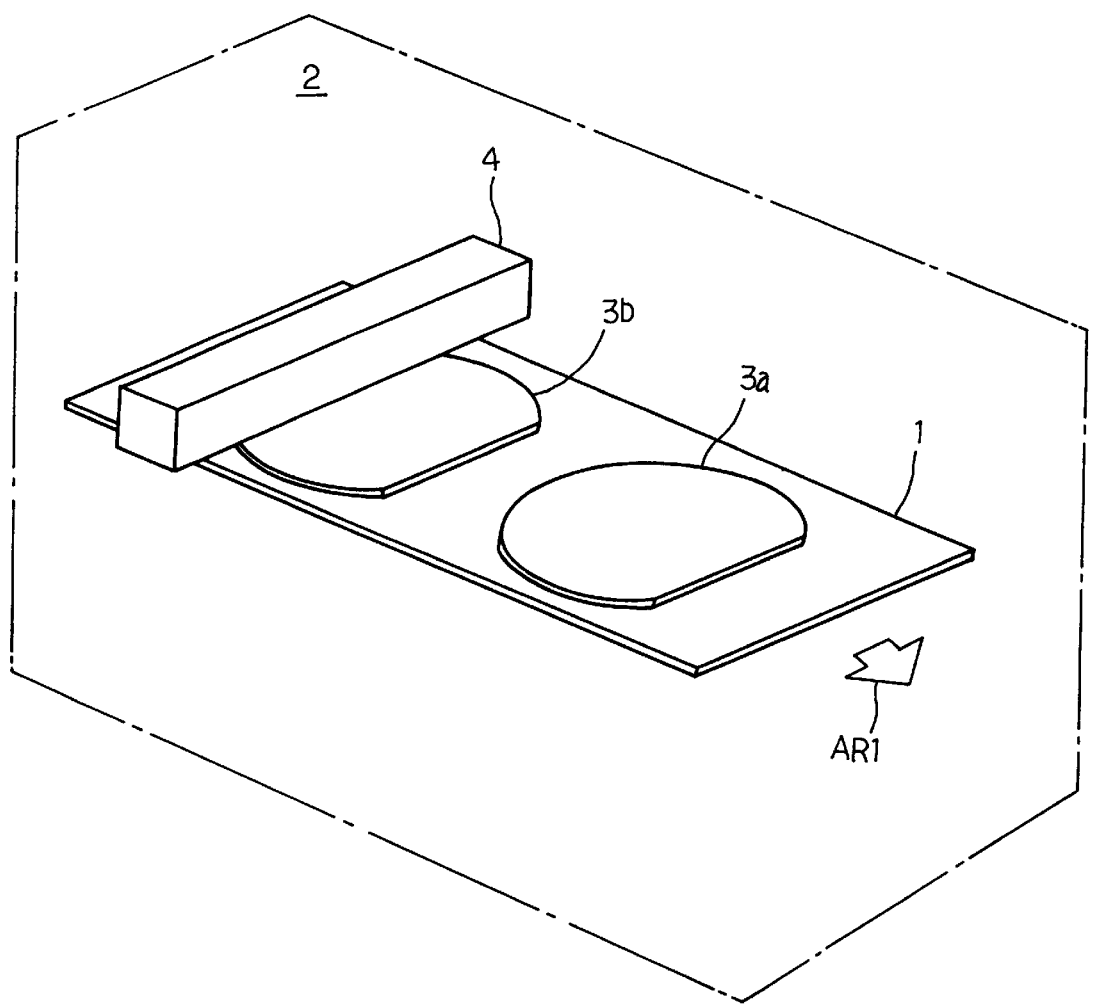
FIG. 1 is a schematic perspective view showing the prior art atmospheric pressure chemical vapor deposition system.
Figure 2:
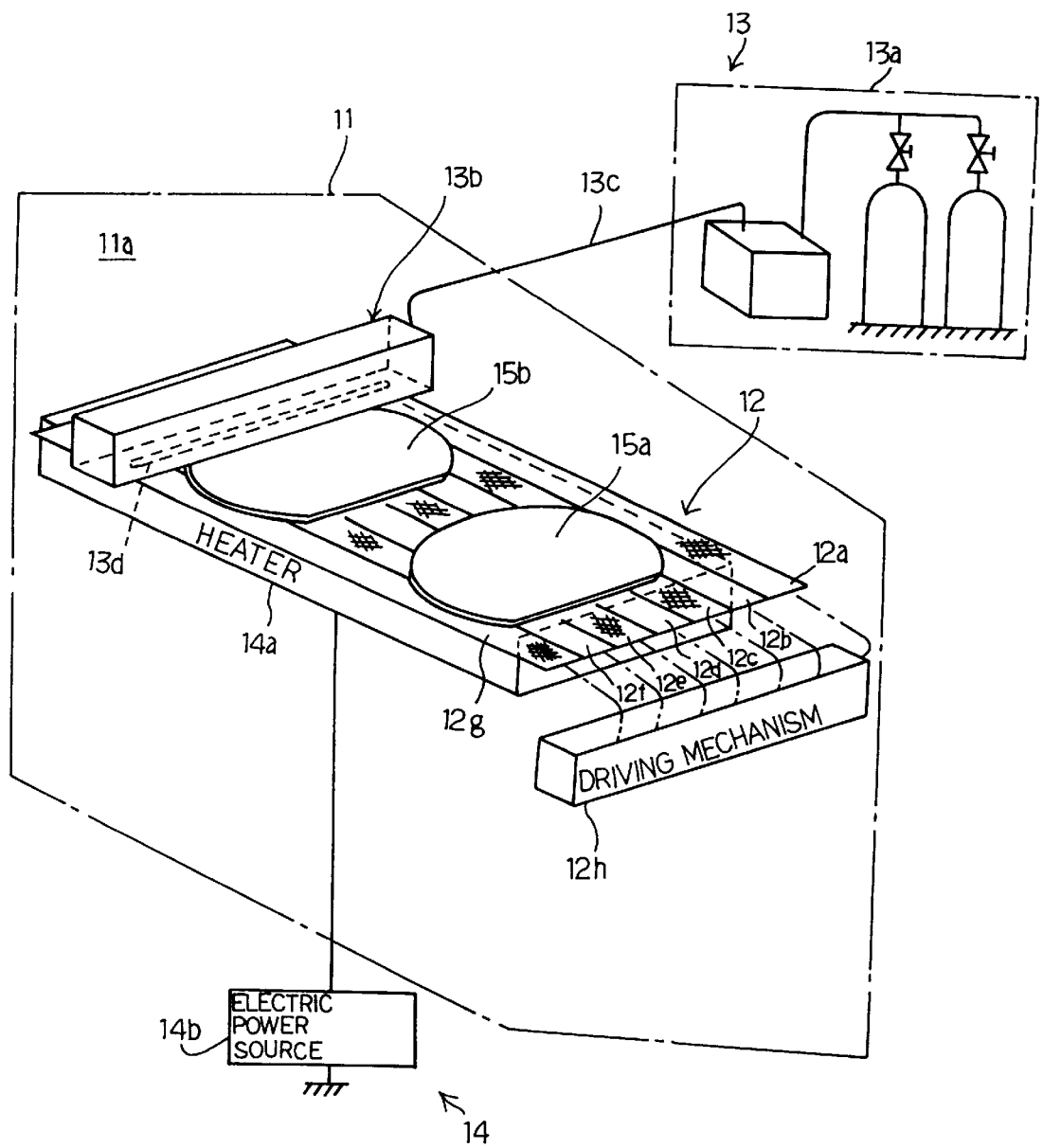
FIG. 2 is a schematic perspective view showing an atmospheric pressure chemical vapor deposition system according to the present invention.

Referring to FIG. 2 of the drawings, an atmospheric pressure chemical vapor deposition system embodying the present invention comprises a reactor 11, and a reaction chamber 11a is defined in the reactor 11. Reacting zone is produced in the reaction chamber 11a as will be described hereinlater.

The atmospheric pressure chemical vapor deposition system further comprises a conveyer 12, a reactant gas injector 13 and a heater 14. The reactant gas injector 13 injects reactant gases to the conveyer 12, and produces the reacting zone over the conveyer 12. The reactant gases produce a predetermined material in the reacting zone. The predetermined material may be a kind of semiconductor, conductive material or dielectric material such as, for example, silicon dioxide, phosphosilicate glass or boro-phosphosilicate glass.

Semiconductor wafers 15a/15b are placed on the conveyer 12, and the conveyer 12 transfers the semiconductor wafers 15a/15b through the reacting zone to a terminal end. The heater 14 is placed under the conveyer 12, and radiates heat through the conveyer 12 to the semiconductor wafers 15a/15b. The semiconductor wafers 15a/15b rise to a target temperature, and the chemical reaction is promoted in the reacting zone. While the semiconductor wafers 15a/15b are passing through the reacting zone, the predetermined material is deposited on the semiconductor wafers 15a/15b, and is grown to a layer over the semiconductor wafers 15a/15b.

Figure 3:
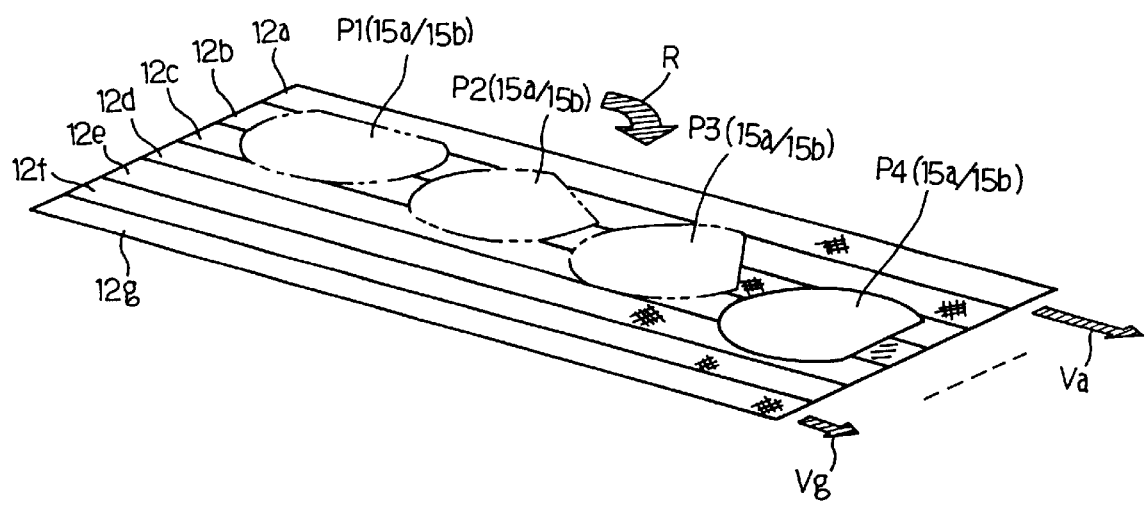
FIG. 3 is a schematic view showing a rotation of a semiconductor wafer on a conveyer incorporated in the atmospheric pressure chemical vapor deposition system shown in FIG. 1.

The conveyer 12 includes plural conveyer belts 12a/12b/12c/12d/12e/ 12f/12g made from a net of suitable meshes and a driving mechanism 12h for driving the conveyer belts 12a to 12g. The conveyer belts 12a to 12g are formed into loops, and are stretched between driving shafts (not shown). The driving mechanism 12h rotates the conveyer belts 12a to 12g at different speeds, and, accordingly, the conveyer belts 12a to 12g are moved at different speeds Va, Vb, Vc, Vd, Ve, Vf and Vg. In this instance, the driving mechanism 12h regulates the conveyer belts 12a/12b/12c/12d/12e/12f/12g to Va>Vb>Vc>Vd>Ve>Vf>Vg. Thus, the driving mechanism 12h produces a relative speed between the conveyer belts 12a to 12g, and the relative speed gives rise to a rotation R of the semiconductor wafer 15a/15b on the conveyer belts 12a to 12g as shown in FIG. 3. In this instance, the conveyer belts rotates the semiconductor wafers 15a/15b in the clockwise direction. The semiconductor wafer 15a/15b is moved from P1 through P2 and P3 to P4, and changes the attitude on the conveyer belts 12a to 12g through the rotation R. The semiconductor wafers 15a/15b are rotated in the reacting zone, and the predetermined material is uniformly grown over the semiconductor wafers 15a/15b.

Turning back to FIG. 2, the reactant gas injector 13 includes a reactant gas source 13a and an injection unit 13b. The reactant gas source 13a is connected through a gas pipe 13c to the injection unit 13b, and an opening 13d is formed in the lower plate of the injection unit 13b. The opening 13d is laterally elongated, and is wider than the diameter of the semiconductor wafer 15a/15b. The reactant gases are downwardly injected from the opening 13d, and create the reacting zone over the semiconductor wafer 15a/15b. The injected reactant gases pass the meshed conveyer belts 12a to 12g, and fresh reactant gases form the reacting zone at all times.

Even if the reacting conditions are different at reacting sub-zones of the reacting zone, the rotating semiconductor wafer 15a/15b exposes the entire surface to the reacting sub-zones, and the growing rate is averaged over the entire surface of the semiconductor wafer 15a/15b. As a result, the layer of predetermined material has a thickness over the entire surface.

The heater 14 includes a heat generating unit 14a placed under the conveyer belts 12a to 12g and an electric power source 14b connected to the heat generating unit 14a. The electric power source 14b energizes the heat generating unit 14a, and heat generating unit 14a radiates heat through the meshed conveyer belts 12a to 12g. As a result, the semiconductor wafers 15a/15b surely rises to the target temperature.

In operation, the semiconductor wafers 15a/15b are placed on the conveyer belts 12a to 12g at intervals, and proceeds through the reacting zone to the terminal end of the conveyer belts 12a to 12g. The heat generating unit 14a heats the semiconductor wafers 15a/15b to the target temperature, and the injection unit 13b flows the fresh reactant gases through the reacting zone. While the semiconductor wafers 15a/15b are proceeding toward the terminal end, the conveyer belts 12a to 12g give rise to the rotation R of the semiconductor wafer 15a/15b due to the relative speed, and the rotating semiconductor wafer 15a/15b uniformly exposes the entire surface to the reaction product or the predetermined material in the reacting sub-zones. As a result, the growth rate of the predetermined material is averaged, and the predetermined material is grown to a constant thickness over the semiconductor wafers 15a/15b.

In this instance, the reactant gas injector 13 serves as a growing means, and the conveyer belts 12a to 12g as a plurality of conveying members. The driving mechanism 12h is corresponding to a controller.

As will be appreciated from the foregoing description, the conveyer belts 12a to 12g are moved at the different speeds Va to Vg, and give rise to the rotation of the semiconductor wafer 15a/15b in the reacting zone. As a result, the growth rate is averaged, and the predetermined material is grown to a constant thickness over the semiconductor wafers 15a/15b.

The relative speed is given by the driving mechanism 12h, and any obstacle against the heat and the gas flow is not placed on the conveyer belts 12a to 12g. For this reason, the reacting conditions are rather uniform in the reacting zone, and the layer of predetermined material is grown to the target thickness more strictly than that of the prior arts.

Moreover, the driving mechanism 12h is not exposed to the heat, and a standard motor and standard mechanical elements are available for the driving mechanism 12h. For this reason, the driving mechanism 12h is more economical than the platens of the prior arts.

Although a particular embodiment of the present invention has been shown and described, it will be apparent to those skilled in the art that various changes and modifications may be made without departing from the spirit and scope of the present invention.

For example, the driving mechanism may increase the moving speed in a different order from that of the preferred embodiment in so far as the conveyer belts give rise to a rotation of the semiconductor wafer.

The present invention may be applied to another kind of growing system.

In order to drive the conveyer belts at different speeds, the driving mechanism may include electric motors respectively associated with the conveyer belts and a controller for regulating the electric motors to respective target speeds. Otherwise, the driving mechanism may have only one electric motor and sprockets different in number of teeth. The sprockets are fixed to a single shaft driven by the electric motor, and the driving force is transferred from the sprockets through chains to respective sprockets fixed to the shafts for the conveyer belts.

In the above-described embodiment, the seven conveyer belts are arranged in parallel. The number of conveyer belts is changeable depending upon the semiconductor wafer size and/or the space available for the conveyer 12.

What is claimed is:

1. A growing system comprising:

growing means creating a growing zone for growing a material on a plurality of substantially flat circular wafers;

a plurality of conveying members passing in parallel through said growing zone, and transferring said wafers disposed thereupon through said growing zone to a destination; and a controller connected to said plurality of conveying members, and regulating said plurality of conveying members to respective moving speeds different from one another so as to give rise to a rotation of each of said wafers disposed on said plurality of conveying members during the transfer through said growing zone to said destination.

2. The growing system as set forth in claim 1, in which said respective different moving speeds are stepwise increased from one of said plurality of conveying members placed at one side of said plurality of conveying members to another of said plurality of conveying members placed at the other side.

3. The growing system as set forth in claim 2, further comprising a heater for heating said wafers to a target temperature appropriate to the growth of the said material in said growing zone.

4. The growing system as set forth in claim 3, in which said material is grown on said wafers through a chemical reaction between a plurality of reactant materials disposed in said growing zone.

5. The growing system as set forth in claim 4, in which said plurality of reactant materials are supplied to the growing zone in vapor phase.

6. The growing system as set forth in claim 5, in which said plurality of reactant materials react at around atmospheric pressure.

7. The growing system as set forth in claim 6, in which said growing means includes a reactant material injecting unit located over said plurality of conveying members and injecting said reactant materials in said vapor phase toward said plurality of conveying members for creating said growing zone.

8. The growing system as set forth in claim 7, in which said plurality of conveying members are formed from a net having a plurality of holes so as to allow said reactant materials to pass therethrough.

9. The growing system as set forth in claim 8, in which said plurality of conveying members allow the heat radiated from said heater placed thereunder to reach said wafers substantially unimpeded.

10. The growing system as set forth in claim 9, in which said controller is located outside of a heating zone between said heater and said wafers.

11. The growing system as set forth in claim 6, in which said wafers are formed of at least one of a semiconductor material a compound semiconductor and a multi-layer composite of semiconductors and insulators.

12. A surface treatment system comprising:

surface treating means for treating surfaces of substantially flat circular wafers;

a plurality of conveying members passing in parallel through said surface treating means, and transferring said wafers through said surface treating means to a destination; and a controller connected to said plurality of conveying members, and regulating said plurality of conveying members to respective moving speeds different from one another to give rise to a rotation of each of said wafers on said plurality of conveying members during said transferring through said surface treating means.

* * * * *